United States Patent
Kramer et al.

(10) Patent No.: US 9,425,739 B1
(45) Date of Patent: Aug. 23, 2016

(54) TUNABLE QUADRATURE OSCILLATOR

(71) Applicant: Texas Instruments Incorporated, Dallas, TX (US)

(72) Inventors: Bradley Allen Kramer, Plano, TX (US); Nirmal C. Warke, Saratoga, CA (US); Hassan Ali, Murphy, TX (US); Swaminathan Sankaran, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/732,367

(22) Filed: Jun. 5, 2015

(51) Int. Cl.
*H03B 5/12* (2006.01)
*H03B 27/00* (2006.01)

(52) U.S. Cl.
CPC ............ *H03B 27/00* (2013.01); *H03B 5/1221* (2013.01); *H03B 5/1237* (2013.01); *H03B 5/1271* (2013.01); *H03B 5/1296* (2013.01)

(58) Field of Classification Search
CPC ............... H03B 27/00; H03B 5/1221; H03B 2200/0078; H03B 5/1212; H03B 5/1215; H03B 5/1228; H03B 5/1237; H03B 5/1271; H03B 5/1296; H03B 2201/02
USPC ............... 331/117 R, 117 FE, 45, 46, 50, 55
See application file for complete search history.

(56) References Cited

U.S. PATENT DOCUMENTS

| | | | | |
|---|---|---|---|---|
| 6,639,481 B1* | 10/2003 | Ravi | .......................... | H03L 7/00 331/177 V |
| 7,239,209 B2* | 7/2007 | Adan | ...................... | H03B 27/00 331/117 FE |
| 7,342,462 B1* | 3/2008 | Chen | ...................... | H03B 27/00 331/117 FE |
| 7,649,424 B2* | 1/2010 | Cusmai | .................. | H03B 27/00 331/117 FE |

OTHER PUBLICATIONS

Liu, Ting-Ping, "A 6.5GHz Monolithic CMOS Voltage-Controlled Oscillator," ISSCC Digest of Technical Papers, Feb. 17, 1999, pp. 404-405, 484.
Razavi, Behzad, Design of Integrated Circuits for Optical Communications, first edition, Sep. 12, 2002, pp. 235-243.

\* cited by examiner

*Primary Examiner* — Ryan Johnson
(74) *Attorney, Agent, or Firm* — Gregory J. Albin; Frank D. Cimino

(57) ABSTRACT

A tunable quadrature oscillator includes a first oscillator having an output, a second oscillator having an output, and a variable gain amplifier. The variable gain amplifier includes an input coupled to the output of the second oscillator, and an output inductively coupled to the output of the first oscillator.

18 Claims, 2 Drawing Sheets

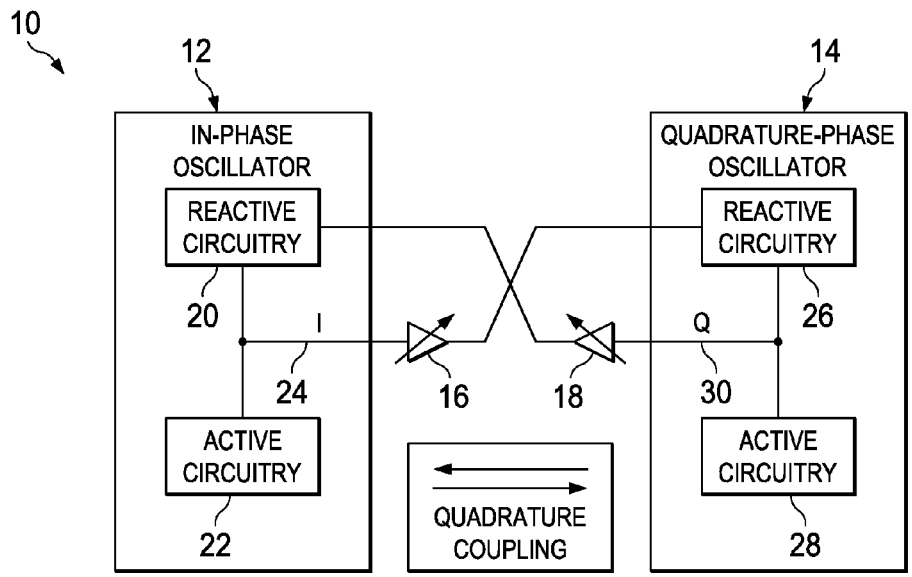
FIG. 1
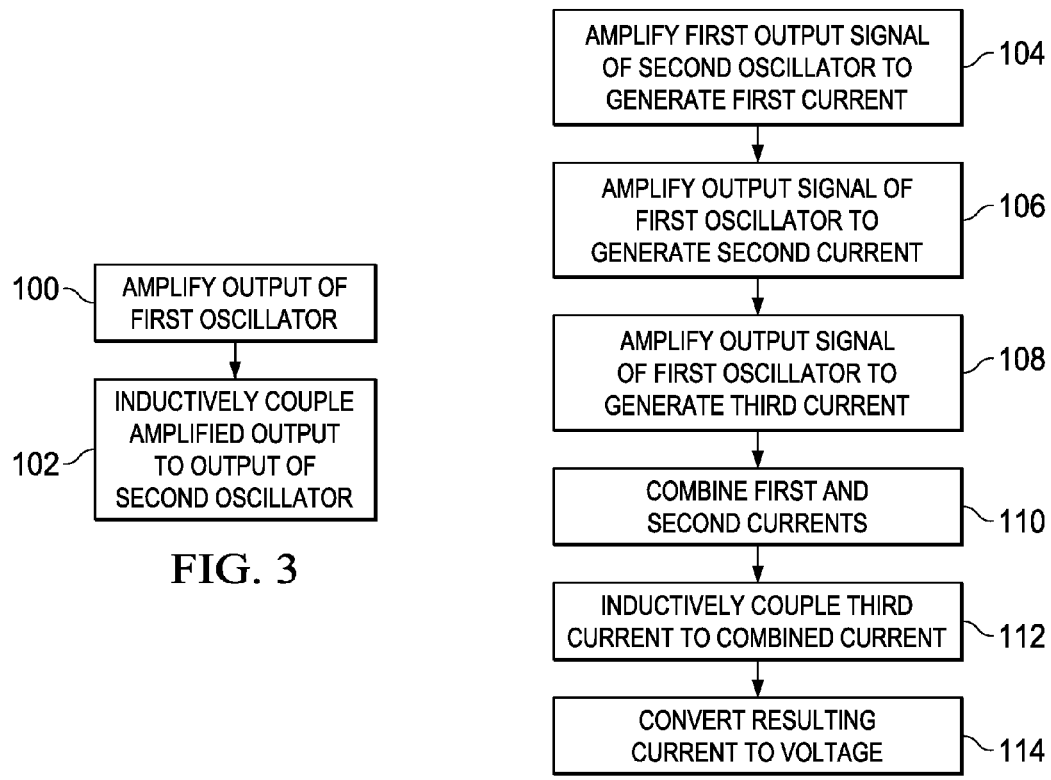
FIG. 3
FIG. 4

TUNABLE QUADRATURE OSCILLATOR

TECHNICAL FIELD

The disclosure relates to oscillators, and in particular, to quadrature oscillators.

BACKGROUND

Quadrature oscillators are used in a wide variety of applications, including frequency synthesizers, local oscillators, clock generators, and receivers. A quadrature oscillator may generate two or more periodic output signals that have a common frequency and that are phase-shifted by 90 degrees with respect to each other. Designing a tunable quadrature oscillator, particularly at high frequencies, can present significant challenges.

SUMMARY

According to some aspects of this disclosure, a device includes a first oscillator, a second oscillator, a first coupling circuit, a second coupling circuit, a first variable gain amplifier, and a second variable gain amplifier. The first oscillator has a first output, and a second output. The second oscillator has a first output, and a second output.

The first coupling circuit has a first input coupled to the second output of the second oscillator, a second input coupled to the first output of the second oscillator, a first output coupled to the first output of the first oscillator, and a second output coupled to the second output of the first oscillator. The second coupling circuit has a first input coupled to the first output of the first oscillator, a second input coupled to the second output of the first oscillator, a first output coupled to the first output of the second oscillator, and a second output coupled to the second output of the second oscillator.

The first variable gain amplifier has a first input coupled to the second output of the second oscillator, a second input coupled to the first output of the second oscillator, a first output inductively coupled to the first output of the first oscillator, a second output inductively coupled to the second output of the first oscillator, and a gain input coupled to an adjustable frequency tuning signal.

The second variable gain amplifier has a first input coupled to the first output of the first oscillator, a second input coupled to the second output of the first oscillator, a first output inductively coupled to the first output of the second oscillator, a second output inductively coupled to the second output of the second oscillator, and a gain input coupled to the adjustable frequency tuning signal.

According to additional aspects of this disclosure, a device includes a first oscillator having an output. The device further includes a second oscillator having an output. The device further includes a variable gain amplifier having an input coupled to the output of the second oscillator, and an output inductively coupled to the output of the first oscillator.

According to additional aspects of this disclosure, a method includes amplifying an output of a first oscillator with a gain that is determined based on an adjustable gain parameter to generate an amplified output signal. The method further includes inductively coupling the amplified output signal to an output of a second oscillator.

According to additional aspects of this disclosure, a device includes circuitry configured to amplify an output of a first oscillator with a gain that is determined based on an adjustable gain parameter to generate an amplified output signal. The circuitry is further configured to inductively couple the amplified output signal to an output of a second oscillator.

BRIEF DESCRIPTION OF THE DRAWINGS

FIG. 1 is a block diagram illustrating an example quadrature oscillator according to this disclosure.

FIG. 3 is a flow diagram illustrating an example technique for tuning a quadrature oscillator according to this disclosure.

FIG. 4 is a flow diagram illustrating another example technique for tuning a quadrature oscillator according to this disclosure.

DETAILED DESCRIPTION

Figure 2:
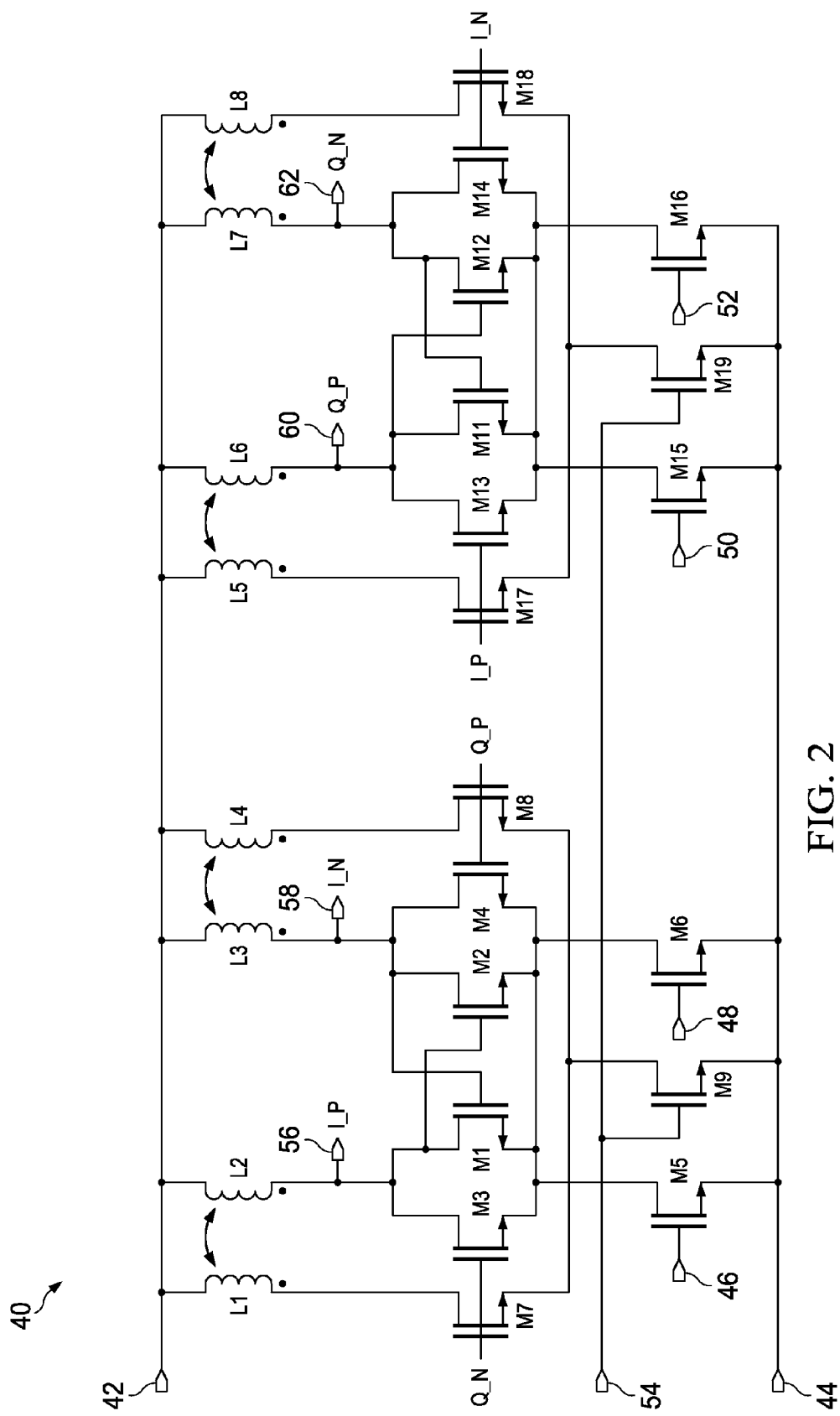
FIG. 2 is a schematic diagram illustrating an example quadrature oscillator that may be used to implement the quadrature oscillator illustrated in FIG. 1.

This disclosure describes techniques for tuning a quadrature oscillator. The techniques may include amplifying an output signal of a first oscillator with a variable gain amplifier, and inductively coupling the amplified output signal to an output of a second oscillator that operates in quadrature with the first oscillator. The techniques for tuning a quadrature oscillator may, in some examples, allow a quadrature oscillator that operates at relatively high frequencies to be tuned with an adjustable frequency tuning parameter.

Some types of quadrature oscillators may use a varactor diode for frequency tuning. At high frequencies, however, a high quality varactor diode sufficient for operating at such frequencies may not be available, may be difficult to obtain, and/or may be costly to implement. The quadrature oscillator frequency tuning techniques described in this disclosure may, in some examples, allow a quadrature oscillator to be tuned by adjusting the gain of a variable gain amplifier. In this way, a tunable high-frequency quadrature oscillator may be obtained without requiring the use of varactor diodes.

Inductively coupling the amplified output signal of one oscillator in a quadrature oscillator to the output of another oscillator in the quadrature oscillator may reduce the amount by which the oscillation frequency of the quadrature oscillator deviates from the resonant frequency of the resonant circuits in the quadrature oscillator relative to other quadrature oscillators that do not include such inductive coupling. Reducing the amount of deviation of the oscillation frequency from the resonant frequency may increase the quality factor of the oscillator, which may in turn reduce the phase noise of the oscillator. In this way, a tunable high-frequency quadrature oscillator may be obtained with relatively low phase noise relative to other quadrature oscillators.

FIG. 1 is a block diagram illustrating an example quadrature oscillator 10 according to this disclosure. Quadrature oscillator 10 includes an in-phase oscillator 12, a quadrature-phase oscillator 14, and variable gain amplifiers 16, 18. In-phase oscillator 12 includes reactive circuitry 20, active circuitry 22, and an output 24. Quadrature-phase oscillator 14 includes reactive circuitry 26, active circuitry 28, and an output 30.

Variable gain amplifier 16 includes an input that is coupled to output 24 of in-phase oscillator 12, and an output that is coupled to quadrature-phase oscillator 14. In some examples, the output of variable gain amplifier 16 may be inductively coupled to quadrature-phase oscillator 14. In further examples, the output of variable gain amplifier 16 may be coupled to and/or inductively coupled to reactive circuitry 26 of quadrature-phase oscillator 14.

Variable gain amplifier 18 includes an input that is coupled to output 30 of quadrature-phase oscillator 14, and an output that is coupled to in-phase oscillator 12. In some examples, the output of variable gain amplifier 18 may be inductively coupled to in-phase oscillator 12. In further examples, the output of variable gain amplifier 18 may be coupled to and/or inductively coupled to reactive circuitry 20 of in-phase oscillator 12.

Reactive circuitry 20 is coupled to active circuitry 22 at a node that corresponds to output 24 of in-phase oscillator 12. Similarly, reactive circuitry 26 is coupled to active circuitry 28 at a node that corresponds to output 30 of quadrature-phase oscillator 14.

Reactive circuitry 20, 26 may each include one or more reactive components, such as, e.g., one or more inductors and/or capacitors. Active circuitry 22, 28 may each include one or more transistors, such as, e.g., one or more cross-coupled transistors.

During operation, quadrature oscillator 10 may generate at least two periodic output signals (I and Q) at outputs 24, 30 that have a same frequency, and that are phase shifted with respect to each other by 90 degrees. Signals that are phase shifted with respect to each other by 90 degrees are said to be in quadrature. In some examples, the periodic output signals may be sinusoidal signals that have a particular frequency.

In-phase oscillator 12 may generate one or more in-phase output signals at output 24, and quadrature-phase oscillator 14 may generate one or more quadrature output signals at output 30. As discussed above, the in-phase and quadrature output signals may be phase-shifted with respect to each other by 90 degrees. When in-phase oscillator 12 and quadrature-phase oscillator 14 generate output signals that are phase-shifted with respect to each other by 90 degrees, then in-phase oscillator 12 and quadrature-phase oscillator 14 are said to operate in quadrature.

To generate the in-phase output signals, in-phase oscillator 12 may include a cross-coupled oscillator. The cross-coupled oscillator may include resonant circuitry that is configured to resonate at a frequency that is proximate to frequencies in the programmable frequency range of quadrature oscillator 10. The cross-coupled oscillator may include at least two cross-coupled amplifiers (e.g., transistor amplifiers and/or tuned amplifiers), thereby causing oscillation to occur at a particular frequency.

Cross-coupled amplifiers may refer to a pair of amplifiers where the output of the first amplifier is coupled to the input of the second amplifier, and the output of the second amplifier is coupled to the input of the first amplifier. In cases where the amplifiers are single-transistor common source amplifiers, a cross-coupled amplifier may refer to a case where the drain (or collector) of a first transistor is coupled to the gate (or base) of a second transistor, and the drain (or collector) of the second transistor is coupled to the gate (or base) of the first transistor.

Tuned amplifiers may refer to amplifiers that have resonant circuitry for a load. In examples where in-phase oscillator 12 includes tuned amplifiers, active circuitry 22 may include cross-coupled transistors and reactive circuitry 20 may form all or part of the resonant load of the cross-coupled transistors. In some examples, reactive circuitry 20 may include one or more LC tank circuits that form resonant loads for the cross-coupled transistors included in active circuitry 22.

In further examples, reactive circuitry 20 may include one or more reactive components, which in combination with one or more the parasitic capacitances associated with the cross-coupled transistors, may form resonant loads for the cross-coupled transistors included in active circuitry 22. For example, reactive circuitry 20 may include an inductor, which in combination with one or more parasitic capacitances associated with the cross-coupled transistors, may form resonant loads for the cross-coupled transistors included in active circuitry 22.

The cross-coupled amplifiers (e.g., tuned amplifiers) may have a resonant frequency at which the amplifiers would resonate without an external stimulus. However, the feedback between oscillators 12, 14 provided by variable gain amplifier 18 and/or other coupling circuitry between oscillators 12, 14 may cause the frequency of oscillation to deviate from the resonant frequency of the cross-coupled amplifiers.

Quadrature-phase oscillator 14 may include similar components and operate in a similar fashion to in-phase oscillator 12. In some examples, the resonant frequency of both of oscillators 12, 14 may be the same, and the amount of deviation from the resonant frequency caused by feedback from the other oscillator may be the same, thereby causing the frequency of the output signals produced at outputs 24, 30 to be the same.

The outputs of each of oscillators 12, 14 may be coupled to the output of the other oscillator with either an inverting configuration or a non-inverting configuration. Coupling with an inverting configuration may refer to coupling the output of one of oscillators 12, 14 to the output of the other with coupling circuitry that is arranged to invert the output (i.e., arranged to shift the phase of the output by 180 degrees). Coupling with a non-inverting configuration may refer to coupling the output of one of oscillators 12, 14 to the output of the other with coupling circuitry that is arranged to not invert the output (i.e., arranged to shift the phase of the output by 0 degrees).

To cause oscillators 12, 14 to operate in quadrature, outputs 24, 30 of oscillators 12, 14 may be coupled to each other in one direction with an inverting configuration, and in the other direction with a non-inverting configuration. For example, output 24 of in-phase oscillator 12 may be coupled to output 30 of quadrature-phase oscillator 14 in a non-inverting configuration, and output 30 of quadrature-phase oscillator 14 may be coupled to output 24 of in-phase oscillator 12 in an inverting configuration. The alternation of coupling configurations may cause the phases of the oscillators 12, 14 to lock in quadrature. Such alternation of coupling may be referred to as quadrature coupling.

As shown in FIG. 1, variable gain amplifier 16 may be used to couple output 24 of in-phase oscillator 12 to output 30 of quadrature-phase oscillator 14 in either an inverting or a non-inverting configuration, and variable gain amplifier 18 may be used to couple output 30 of quadrature-phase oscillator 14 to output 24 of in-phase oscillator 12 in either an inverting or a non-inverting configuration. Other coupling circuitry (not shown in FIG. 1, but shown in FIG. 2) may also be used to couple oscillators 12, 14 to each other in addition to variable gain amplifiers 16, 18.

When other coupling circuitry is used in addition to variable gain amplifiers 16, 18, such coupling circuitry may have an inverting or non-inverting configuration that corresponds to the configurations of variable gain amplifiers 16, 18. For example, when variable gain amplifier 16 is arranged to couple output 24 of in-phase oscillator 12 to output 30 of quadrature-phase oscillator 14 in a non-inverting configuration and when variable gain amplifier 18 is arranged to couple output 30 of quadrature-phase oscillator 14 to output 24 in-phase oscillator 12 in an inverting configuration, the additional coupling circuitry may also be arranged to couple output 24 of in-phase oscillator 12 to output 30 of quadrature-phase oscillator 14 in a non-inverting configuration and to couple output 30 of quadrature-phase oscillator 14 to output 24 of in-phase oscillator 12 in an inverting configuration.

Variable gain amplifiers 16, 18 may each include a variable gain input that is coupled to a frequency tuning signal. Quadrature oscillator 10 may determine and adjust the frequency of the periodic output signals generated at outputs 24, 30 based on the frequency tuning signal received at the variable gain inputs of variable gain amplifiers 16, 18. In this way, a tunable high-frequency quadrature oscillator may be obtained without requiring the use of varactor diodes.

As discussed above, the output of variable gain amplifier 16 may be inductively coupled to output 30 of quadrature-phase oscillator 14, and the output of variable gain amplifier 18 may be inductively coupled to output 24 of in-phase oscillator 12. Inductively coupling the outputs of variable gain amplifiers 18, 16 to outputs 24, 30 of oscillators 12, 14 in this manner may reduce the amount by which the oscillation frequency of quadrature oscillator 10 deviates from the resonant frequency of the resonant circuits in quadrature oscillator 10 relative to other quadrature oscillators that do not include such inductive coupling. Reducing the amount of deviation of the oscillation frequency from the resonant frequency may increase the quality factor of quadrature oscillator 10, which may in turn reduce the phase noise of quadrature oscillator 10. In this way, a tunable high-frequency quadrature oscillator 10 may be obtained with relatively low phase noise relative to other quadrature oscillators.

In some examples, outputs 24, 30 may be differential outputs, and the at least two periodic signals that are produced at outputs 24, 30 may be differential periodic signals. In such examples, in-phase oscillator 12 may generate a first output signal and a second output signal at output 24. The second output signal may be phase-shifted by 180 degrees with respect to the first output signal. Similarly, in examples where outputs 24, 30 are differential outputs, quadrature-phase oscillator 14 may generate a first output signal and a second output signal at output 30, and the second output signal may be phase-shifted by 180 degrees with respect to the first output signal.

In such examples, the first output signal generated by quadrature-phase oscillator 14 may be phase-shifted by 90 degrees with respect to the first output signal generated by in-phase oscillator 12. Similarly, the second output signal generated by quadrature-phase oscillator 14 may likewise be phase-shifted by 90 degrees with respect to the second output signal generated by in-phase oscillator 12.

In such examples, the first and second output signals generated by in-phase oscillator 12 may be referred to, respectively, as the 0 degree signal and the 180 degree signal. Similarly, the first and second output signals generated by quadrature-phase oscillator 14 may be referred to, respectively, as the 90 degree signal and the 270 degree signal. As such, in examples where outputs 24, 30 are differential outputs, quadrature oscillator 10 may be said to generate four periodic output signals.

Alternatively, the first and second output signals generated by in-phase oscillator 12 may be referred to, respectively, as the positive polarity output signal and the negative polarity output signal. Likewise, the first and second output signals generated by quadrature-phase oscillator 14 may be referred to, respectively, as the positive polarity output signal and the negative polarity output signal.

In examples where outputs 24, 30 are differential outputs, coupling output 30 of quadrature-phase oscillator 14 to output 24 in-phase oscillator 12 in an inverting configuration may involve coupling output 30 to output 24 such that polarities are reversed. In other words, such coupling may involve coupling output 30 to output 24 such that the positive polarity output signal of output 30 is coupled to the negative polarity output signal of output 24 and such that the negative polarity output signal of output 30 is coupled to the positive polarity output signal of output 24.

In such examples, coupling output 24 of in-phase oscillator 12 to output 30 quadrature-phase oscillator 14 in a non-inverting configuration may involve coupling output 24 to output 30 such that polarities are not reversed (i.e., matching). In other words, such coupling may involve coupling output 24 to output 30 such that the positive polarity output signal of output 24 is coupled to the positive polarity output signal of output 30 and such that the negative polarity output signal of output 24 is coupled to the negative polarity output signal of output 30.

In some examples, each of oscillators 12, 14 may be a voltage-controlled oscillator (VCO). In further examples, reactive circuitry 20 and reactive circuitry 26 may be tank circuitry.

FIG. 2 is a schematic diagram illustrating an example quadrature oscillator 40 that may be used to implement quadrature oscillator 10 illustrated in FIG. 1. Quadrature oscillator 40 includes transistors M1, M2, M3, M4, M5, M6, M7, M8, M9, M11, M12, M13, M14, M15, M16, M17, M18, M19, inductors L1, L2, L3, L4, L5, L6, L7, L8, rails 42, 44, bias current control signals 46, 48, 50, 52, a frequency tuning signal 54, and outputs 56, 58, 60, 62.

Transistor M1 has a source terminal coupled to: (1) a source terminal of transistor M3, (2) a source terminal of transistor M2, (3) a source terminal of transistor M4, (4) a drain terminal of transistor M5, and (5) a drain terminal of transistor M6. Transistor M1 also has a drain terminal coupled to: (1) a drain terminal of transistor M3, (2) a gate terminal of transistor M2, (3) output 56, and (4) a first terminal of inductor L2. The drain terminal of transistor M1 is inductively coupled to a drain terminal of transistor M7 via inductors L1, L2. Transistor M1 also has a gate terminal coupled to: (1) a drain terminal of transistor M2, (2) a drain terminal of transistor M4, (3) output 58, and (4) a first terminal of inductor L3. The gate terminal of transistor M1 is inductively coupled to a drain terminal of transistor M8 via inductors L3, L4.

Transistor M2 has a source terminal coupled to: (1) a source terminal of transistor M3, (2) a source terminal of transistor M1, (3) a source terminal of transistor M4, (4) a drain terminal of transistor M5, and (5) a drain terminal of transistor M6. Transistor M2 also has a drain terminal coupled to: (1) a drain terminal of transistor M4, (2) a gate terminal of transistor M1, (3) output 58, and (4) a first terminal of inductor L3. The drain terminal of transistor M2 is inductively coupled to a drain terminal of transistor M8 via inductors L3, L4. Transistor M2 also has a gate terminal coupled to: (1) a drain terminal of transistor M1, (2) a drain terminal of transistor M3, (3) output 56, and (4) a first terminal of inductor L2. The gate terminal of transistor M2 is inductively coupled to a drain terminal of transistor M7 via inductors L1, L2.

Transistor M3 has a source terminal coupled to: (1) a source terminal of transistor M1, (2) a source terminal of transistor M2, (3) a source terminal of transistor M4, (4) a drain terminal of transistor M5, and (5) a drain terminal of transistor M6. Transistor M3 also has a drain terminal coupled to: (1) a drain terminal of transistor M1, (2) a gate terminal of transistor M2, (3) output 56, and (4) a first terminal of inductor L2. The drain terminal of transistor M3 is inductively coupled to a drain terminal of transistor M7 via inductors L1, L2. Transistor M3 also has a gate terminal coupled to output 62.

Transistor M4 has a source terminal coupled to: (1) a source terminal of transistor M3, (2) a source terminal of transistor M1, (3) a source terminal of transistor M2, (4) a drain terminal of transistor M5, and (5) a drain terminal of transistor M6. Transistor M4 also has a drain terminal coupled to: (1) a drain terminal of transistor M2, (2) a gate terminal of transistor M1, (3) output 58, and (4) a first terminal of inductor L3. The drain terminal of transistor M4 is inductively coupled to a drain terminal of transistor M8 via inductors L3, L4. Transistor M4 also has a gate terminal coupled to output 60.

Transistor M5 has a source terminal coupled to rail 44. Transistor M5 also has a gate terminal coupled to bias current control signal 46. Transistor M5 also has a drain terminal coupled to: (1) a source terminal of transistor M1, (2) a source terminal of transistor M2, (3) a source terminal of transistor M3, (4) a source terminal of transistor M4, and (5) a drain terminal of transistor M6.

Transistor M6 has a source terminal coupled to rail 44. Transistor M6 also has a gate terminal coupled to bias current control signal 48. Transistor M6 also has a drain terminal coupled to: (1) a source terminal of transistor M1, (2) a source terminal of transistor M2, (3) a source terminal of transistor M3, (4) a source terminal of transistor M4, and (5) a drain terminal of transistor M5.

Transistor M7 has a source terminal coupled to: (1) a source terminal of transistor M8, and (2) a drain terminal of transistor M9. Transistor M7 also has a gate terminal coupled to output 62. Transistor M7 also has a drain terminal coupled to a first terminal of inductor L1. The drain terminal of transistor M7 is inductively coupled to: (1) output 56, (2) a drain terminal of transistor M3, (3) a drain terminal of transistor M1, and (4) a gate terminal of transistor M2 via inductors L1, L2.

Transistor M8 has a source terminal coupled to: (1) a source terminal of transistor M7, and (2) a drain terminal of transistor M9. Transistor M8 also has a gate terminal coupled to output 60. Transistor M8 also has a drain terminal coupled to a first terminal of inductor L4. The drain terminal of transistor M8 is inductively coupled to: (1) output 58, (2) a drain terminal of transistor M2, (3) a drain terminal of transistor M4, and (4) a gate terminal of transistor M1 via inductors L3, L4.

Transistor M9 has a source terminal coupled to rail 44. Transistor M9 also has a gate terminal coupled to frequency tuning signal 54. Transistor M9 also has a drain terminal coupled to: (1) a source terminal of transistor M7, and (2) a source terminal of transistor M8.

Inductor L1 has a first terminal coupled to the drain of transistor M7, and a second terminal coupled to rail 42. Inductor L2 has a first terminal coupled to: (1) output 56, (2) the drain of transistor M1, (3) the drain of transistor M3, (4) and the gate of transistor M2. Inductor L2 has a second terminal coupled to rail 42.

Inductor L3 has a first terminal coupled to: (1) output 58, (2) the drain of transistor M2, (3) the drain of transistor M4, (4) and the gate of transistor M1. Inductor L3 has a second terminal coupled to rail 42. Inductor L4 has a first terminal coupled to the drain of transistor M8, and a second terminal coupled to rail 42.

Transistors M11, M12, M13, M14, M15, M16, M17, M18, M19 and inductors L5, L6, L7, L8 are configured in a similar manner to transistors M1, M2, M3, M4, M5, M6, M7, M8, M9 and inductors L1, L2, L3, L4, respectively, except that (1) outputs 56, 58 and outputs 60, 62 are interchanged, and (2) the gates of transistors M13, M14, M17, M18 are coupled to outputs 56, 58 with a non-inverting configuration rather than an inverting configuration. Specifically, the gates of transistors M13 and M17 are coupled to output 56, and the gates of transistors M14 and M18 are coupled to output 58.

In some examples, transistors M1, M2, M3, M4, M5, M6 and inductors L1, L2, L3, L4 of FIG. 2 may be used to form in-phase oscillator 12 shown in FIG. 1, and transistors M11, M12, M13, M14, M15, M16 and inductors L5, L6, L7, L8 of FIG. 2 may be used to form quadrature-phase oscillator 14 shown in FIG. 1. In such examples, transistors M7, M8, M9 of FIG. 2 may be used to form variable gain amplifier 18 of FIG. 1, and transistors M17, M18, M19 may be used to form variable gain amplifier 16 of FIG. 1. In such examples, outputs 56, 58 may correspond to output 24 shown in FIG. 1, and outputs 60, 62 may correspond to output 30 shown in FIG. 1.

In some examples, transistors M1, M2, M3, M4, M5, M6 may be used to form active circuitry 22 shown in FIG. 1, and inductors L1, L2, L3, L4 may be used to form reactive circuitry 20 shown in FIG. 1. In such examples, transistors M11, M12, M13, M14, M15, M16 may be used to form active circuitry 28 shown in FIG. 1, and inductors L5, L6, L7, L8 may be used to form reactive circuitry 26 shown in FIG. 1.

In some examples, transistors M3, M4 may be used to form coupling circuitry that directly couples outputs 60, 62 to outputs 56, 58 with an inverting configuration. Similarly, transistors M13, M14 may be used to form coupling circuitry that directly couples outputs 56, 58 to outputs 60, 62 in a non-inverting configuration. In such examples, the coupling circuitry may be included in or separate from one or both of active circuitry 22, 28 illustrated in FIG. 1. Similarly, the coupling circuitry may be included in or separate from one or both of in-phase oscillator 12 and quadrature-phase oscillator 14 illustrated in FIG. 1.

As shown in FIG. 2, inductors L1, L2 each include a dot that indicates the relative orientation of windings in each of inductors, L1, L2 with respect to the other. The dots indicate that instantaneous direction of the current entering inductor L1 at the dotted terminal is the same as the instantaneous direction of the current leaving inductor L2 at the dotted terminal. Similar dots are included in FIG. 2 for inductor pairs L3, L4; L5, L6; and L7, L8. It should be noted that the relative orientations of inductor windings shown in FIG. 2 is merely one example. In other examples, the relative orientations may be different. For example, the dotted terminal for inductors L1, L3, L5, L7 may remain the same, but the dotted terminal for L2, L4, L6, L8 may be switched to the terminal that is connected to rail 42.

Inductors L1, L2 may form a set of magnetically coupled inductors. In some examples, inductors L1, L2 may be a transformer. Similarly inductors L3, L4, inductors L5, L6, and inductors L7, L8 may each form a respective set of magnetically coupled inductors or a respective transformer.

One or more of inductors L1, L2 in combination with one or more parasitic capacitances of any of transistors M1, M3, M7 may form a resonant circuit that has a resonant frequency. Similarly: (1) one or more of inductors L3, L4 in combination with one or more parasitic capacitances of any of transistors M2, M4, M8 may form a resonant circuit that has a resonant frequency, (2) one or more of inductors L5, L6 in combination with one or more parasitic capacitances of any of transistors M11, M13, M17 may form a resonant circuit that has a resonant frequency, and (3) one or more of inductors L7, L8 in combination with one or more parasitic capacitances of any of transistors M12, M14, M18 may form resonant circuitry that has a resonant frequency. In some examples, the resonant frequency of each of the resonant circuits may be equal or approximately equal.

The example quadrature oscillator 40 shown in FIG. 2 includes one or more bias current sources (e.g., transistors M5, M6) that provide bias current for both the cross-coupled transistors (M1, M2) and the coupling circuit (M3, M4). Similarly, quadrature oscillator 40 also includes one or more bias current sources (e.g., transistor M15, M16) that provide bias current for both the cross-coupled transistors (M11, M12) and the coupling circuit (M13, M14). The bias current sources formed by transistors M5, M6, M15, M16 may be controlled, respectively, by bias current control signals 46, 68, 50, 52. Although illustrated as separate signals in FIG. 2, in some examples, one or more of bias current control 46, 68, 50, 52 may be the same signal.

Transistors M1, M2 may form a pair of cross-coupled transistors. Similarly, transistors M11, M12 may form another pair of cross-coupled transistors. Each of the pairs of cross-coupled transistors may form one or more common source amplifiers with one or more resonant loads.

The common source amplifiers may be referred to as tuned amplifiers and/or cross-coupled tuned amplifiers. For example, the gate of transistor M1 may correspond to the input of a first tuned amplifier, and the drain of transistor M1 may correspond to the output of a first tuned amplifier. Similarly, the gate of transistor M2 may correspond to the input of a second tuned amplifier, and the drain of transistor M2 may correspond to the output of a second tuned amplifier. The tuned amplifiers may be cross-coupled in the sense that the output of the second tuned amplifier may be coupled to the input of the first tuned amplifier, and the output of the first tuned amplifier may be coupled to the input of the second tuned amplifier.

The cross-coupled tuned amplifiers (e.g., transistors M1, M2) may have a resonant frequency at which the amplifiers would resonant without an external stimulus. However, the feedback provided by transistors M3, M4, M7 and M8 may cause the frequency of oscillation to deviate from the resonant frequency of the resonant load.

Transistors M11, M12, M13, M14, M15, M16, M17, M18, M19 may operate in a similar manner to transistors M1, M2, M3, M4, M5, M6, M7, M8, M9. In some examples, the resonant frequency of both of oscillators 12, 14 may be the same, and the amount of deviation from the resonant frequency caused by feedback from the other oscillator may be the same, thereby causing the frequency of the output signals produced at outputs 24, 30 to be the same.

To cause oscillators 12, 14 to operate in quadrature, outputs 56, 58 may be coupled to outputs 60, 62 in a non-inverting configuration, and outputs 60, 62 may be coupled to outputs 56, 58 in an inverting configuration. Specifically, the coupling circuit formed by transistors M3, M4 and the variable gain amplifier formed by transistors M7, M8, M9 may couple outputs 60, 62 to outputs 56, 58 with an inverting configuration, and the coupling circuit formed by transistors M13, M14 and the variable gain amplifier formed by transistors M17, M18, M19 may couple outputs 56, 58 to outputs 60, 62 with a non-inverting configuration. The alternation of coupling configurations may cause the phases of the outputs 56, 58 and outputs 60, 62 to lock in quadrature.

As discussed above, the feedback between oscillators 12, 14 may cause the frequency of oscillation to deviate from the resonant frequency of the resonant loads. The amount of deviation may be determined by the gain of the variable gain amplifier formed by transistors M7, M8 and M9 and the gain of the variable gain amplifier formed by transistors M17, M18 and M19, both of which may be controlled by frequency tuning signal 54.

Consequently, quadrature oscillator 40 may determine and adjust the frequency of the periodic output signals generated at outputs 56, 58, 60, 62 based on the frequency tuning signal 54 coupled to the variable gain inputs of variable gain amplifiers 16, 18. In this way, a tunable high-frequency quadrature oscillator 40 may be obtained without requiring the use of varactor diodes.

The output of the variable gain amplifier formed by transistors M7, M8, M9 may be inductively coupled to outputs 56, 58 via inductors L1, L2, L3, L4, and the output of the variable gain amplifier formed by transistors M17, M18, M19 may be inductively coupled to outputs 60, 62 via inductors L5, L6, L7, L8. Inductively coupling the outputs of the variable gain amplifiers to outputs 56, 58, 60, 62 of the oscillators in this manner may reduce the amount by which the oscillation frequency of quadrature oscillator 50 deviates from the resonant frequency of the resonant circuits in quadrature oscillator 40 relative to quadrature oscillators that do not include such inductive coupling. Reducing the amount of deviation of the oscillation frequency from the resonant frequency may increase the quality factor of quadrature oscillator 40, which may in turn reduce the phase noise of quadrature oscillator 40. In this way, a tunable high-frequency quadrature oscillator 40 may be obtained with relatively low phase noise relative to other quadrature oscillators.

In some examples, the techniques of this disclosure may provide a quadrature oscillator (e.g., quadrature oscillators 10, 40) that includes a first oscillator (e.g., in-phase oscillator 12, transistors M1, M2), a second oscillator (e.g., quadrature-phase oscillator 14, transistors M11, M12), a first coupling circuit (e.g., transistors M3, M4), a second coupling circuit (e.g., transistors M13, M14), a first variable gain amplifier (e.g., variable gain amplifier 18, transistors M7, M8, M9), and a second variable gain amplifier (e.g., variable gain amplifier 16, transistors M17, M18, M19).

In such examples, the first oscillator has a first output (e.g., output 56) and a second output (e.g., output 58). The second oscillator has a first output (e.g., output 60) and a second output (e.g., output 62).

In such examples, the first coupling circuit (e.g., transistors M3, M4) has: (1) a first input (e.g., gate of transistor M3) coupled to the second output (e.g., output 62) of the second oscillator, (2) a second input (e.g., gate of transistor M4) coupled to the first output (e.g., output 60) of the second oscillator, (3) a first output (e.g., drain of transistor M3) coupled to the first output (e.g., output 56) of the first oscillator, and (4) a second output (e.g., drain of transistor M4) coupled to the second output (e.g., output 58) of the first oscillator.

In such examples, the second coupling circuit (e.g., transistors M13, M14) has: (1) a first input (e.g., gate of transistor M13) coupled to the first output (e.g., output 56) of the first oscillator, (2) a second input (e.g., gate of transistor M14) coupled to the second output (e.g., output 58) of the first oscillator, (3) a first output (e.g., drain of transistor M13) coupled to the first output (e.g., output 60) of the second oscillator, and (4) a second output (e.g., drain of transistor M14) coupled to the second output (e.g., output 62) of the second oscillator.

In such examples, the first variable gain amplifier (e.g., transistors M7, M8, M9) has: (1) a first input (e.g., gate of transistor M7) coupled to the second output (e.g., output 62) of the second oscillator, (2) a second input (e.g., gate of transistor M8) coupled to the first output (e.g., output 60) of the second oscillator, (3) a first output (e.g., drain of transistor M7) inductively coupled to the first output (e.g., coupled to output 56 via inductors L1, L2) of the first oscillator, (4) a second output (e.g., drain of transistor M8) inductively coupled to the second output (e.g., coupled to output 58 via inductors L3, L4) of the first oscillator, and (5) a gain input (e.g., gate of transistor M9) coupled to an adjustable frequency tuning signal (e.g., frequency tuning signal 54).

In such examples, the second variable gain amplifier (e.g., transistors M17, M18, M19) has (1) a first input (e.g., gate of transistor M17) coupled to the first output (e.g., output 56) of the first oscillator, (2) a second input (e.g., gate of transistor M18) coupled to the second output (e.g., output 58) of the first oscillator, (3) a first output (e.g., drain of transistor M17) inductively coupled to the first output of the second oscillator (e.g., coupled to output 60 via inductors L5, L6), (4) a second output (e.g., drain of transistor M18) inductively coupled to the second output of the second oscillator (e.g., coupled to output 62 via inductors L7, L8), and (5) a gain input (e.g., gate of transistor M19) coupled to the adjustable frequency tuning signal (e.g., frequency tuning signal 54).

In some examples, the quadrature oscillator (e.g., quadrature oscillators 10, 40) has four sets of magnetically coupled inductors. A first set of magnetically coupled inductors (e.g., inductors L1, L2) has: (1) a first terminal coupled to the first output (e.g., the drain of transistor M7) of the first variable gain amplifier, and (2) a second terminal coupled to the first output (e.g., output 56) of the first oscillator. A second set of magnetically coupled inductors has: (1) a first terminal coupled to the second output (e.g., the drain of transistor M8) of the first variable gain amplifier, and (2) a second terminal coupled to the second output (e.g., output 58) of the first oscillator. A third set of magnetically coupled inductors has: (1) a first terminal coupled to the first output (e.g., the drain of transistor M17) of the second variable gain amplifier, and (2) a second terminal coupled to the first output (e.g., output 60) of the second oscillator. A fourth set of magnetically coupled inductors has: (1) a first terminal coupled to the second output (e.g., the drain of transistor M18) of the second variable gain amplifier, and (2) a second terminal coupled to the second output (e.g., output 62) of the second oscillator.

In some examples, the techniques of this disclosure may provide a quadrature oscillator (e.g., quadrature oscillators 10, 40) that includes a first oscillator (e.g., in-phase oscillator 12; transistors M1, M2) having an output (e.g., output 24; outputs 56, 58); a second oscillator (e.g., quadrature-phase oscillator 14; transistors M11, M12) having an output (e.g., output 30; outputs 60, 62); and a variable gain amplifier (e.g., variable gain amplifier 18; transistors M7, M8, M9) having: an input (e.g., input of variable gain amplifier 18; gates of transistors M7, M8) coupled to the output (e.g., output 30; outputs 60, 62) of the second oscillator, and an output (e.g., output of variable gain amplifier 18; drains of transistors M7, M8) inductively coupled to the output (e.g., output 24; outputs 56, 58) of the first oscillator (e.g., via inductors L1, L2, L3, L4).

In some examples, the quadrature oscillator (e.g., quadrature oscillators 10, 40) further includes a coupling circuit (e.g., transistors M3, M4) having: (1) an input (e.g., gates of transistors M3, M4) coupled to the output (e.g., output 30; outputs 60, 62) of the second oscillator, and (2) an output (e.g., drains of transistors M3, M4) directly coupled to the output (e.g., output 24; outputs 56, 58) of the first oscillator.

In some examples, the quadrature oscillator (e.g., quadrature oscillators 10, 40) includes a set of magnetically coupled inductors (e.g., inductors L1, L2, L3, L4) having: (1) a first terminal coupled to the output (e.g., drains of transistors M7, M8) of the variable gain amplifier, and (2) a second terminal coupled to the output (e.g., output 24; outputs 56, 58) of the first oscillator. In some examples, the set of magnetically coupled inductors (e.g., inductors L1, L2, L3, L4) includes one or more transformers.

In some examples, each of the first, second, third, and fourth sets of magnetically coupled inductors may be a respective transformer. In further examples, each of the first and second variable gain amplifiers may be a variable gain differential amplifier.

In some examples, the variable gain amplifier (e.g., variable gain amplifier 18; transistors M7, M8, M9) is configured to amplify the output (e.g., output 30; outputs 60, 62) of the second oscillator with a gain that is determined based on an adjustable gain parameter (e.g., frequency tuning signal 54) to generate an amplified output signal (e.g., drains of transistors M7, M8). In such examples, the set of magnetically coupled inductors (e.g., inductors L1, L2, L3, L4) is configured to inductively couple the amplified output signal (e.g., drains of transistors M7, M8) to the output (e.g., output 24; outputs 56, 58) of the first oscillator.

In some examples, the variable gain amplifier (e.g., variable gain amplifier 18; transistors M7, M8, M9) includes a gain input (e.g., gate of transistor M9) configured to receive an adjustable gain parameter.

In some examples, the quadrature oscillator (e.g., quadrature oscillators 10, 40) includes a second variable gain amplifier (e.g., variable gain amplifier 16; transistors M17, M18, M19) having: (1) an input (e.g., gates of transistors M17, M18) coupled to the output (e.g., output 24; outputs 56, 58) of the first oscillator, and an output (drains of transistors M17, M18) inductively coupled to the output (e.g., output 30; outputs 60, 62) of the second oscillator.

In some examples, the output of the first oscillator includes a first output (e.g., output 56) and a second output (e.g., output 58). In such examples, the quadrature oscillator (e.g., quadrature oscillators 10, 40) includes a set of mutually coupled inductors (e.g., inductors L1, L2) having: (1) a first terminal (e.g., terminal of inductor L1 coupled to drain of transistor M7), and (2) a second terminal (terminal of inductor L2) coupled to the first output (e.g., output 56) of the first oscillator.

In such examples, the first oscillator includes a first transistor (e.g., transistor M1) having: (1) a source terminal coupled to one or more current sources (e.g., transistors M5, M6), (2) a drain terminal coupled to the first output (e.g., output 56) of the first oscillator and to the second terminal (e.g., terminal of inductor L2) of the set of mutually coupled inductors, and (3) a gate terminal coupled to a second output (e.g., output 58) of the first oscillator.

In such examples, the quadrature oscillator (e.g., quadrature oscillators 10, 40) includes a coupling circuit that includes a second transistor (e.g., transistor M3) having: (1) a source terminal coupled to the one or more current sources (e.g., transistors M5, M6), (2) a drain terminal coupled to the first output (e.g., output 56) of the first oscillator, the drain terminal of the first transistor (e.g., transistor M1), and the second terminal (e.g., terminal of inductor L2) of the set of mutually coupled inductors, and (3) a gate terminal coupled to the output (e.g., output 62) of the second oscillator.

In such examples, the variable gain amplifier (e.g., variable gain amplifier 18, transistors M7, M8, M9) includes a third transistor (e.g., transistor M7) having: (1) a source terminal coupled to a current source (e.g., transistor M9), (2) a drain terminal coupled to the first terminal of the set of mutually coupled inductors (e.g., terminal of inductor L1), and (3) a gate terminal coupled to the output (e.g., output 62) of the second oscillator.

In some examples, the output of the first oscillator includes a first output (e.g., output 56) and a second output (e.g., output 58). In such examples: (1) the first oscillator includes a first transistor (e.g., transistor M1) configured to generate a first current based on the second output (e.g., output 58) of the first oscillator, (2) the first coupling circuit includes a second transistor (e.g., transistor M3) configured to generate a second current based on the output of the second oscillator (e.g., output 62), and (3) the first variable gain amplifier includes a third transistor (e.g., transistor M7) configured to generate a third current based on the output (e.g., output 62) of the second oscillator.

In such examples, the first oscillator may further include a current path (e.g., current path between rail 42 and drains of transistors M1, M3), and a junction node (e.g., node at drains of transistors M1, M3) configured to combine the first and second currents to form a first current component of a fourth current that flows through the current path. In such examples, the quadrature oscillator (e.g., quadrature oscillators 10, 40) includes a set of mutually coupled inductors (e.g., inductors L1, L2) configured to inductively couple the third current to the current path to generate a second current component of the fourth current that flows through the current path. In such examples, the quadrature oscillator (e.g., quadrature oscillators 10, 40) includes circuitry (e.g., inductor L2) configured convert the fourth current to a voltage that forms the first output (e.g., output 56) of the first oscillator.

FIG. 3 is a flow diagram illustrating an example technique for tuning a quadrature oscillator according to this disclosure. The technique illustrated in FIG. 3 may be implemented in any of the circuits described in this disclosure, including the circuits illustrated in FIGS. 1 and 2.

Variable gain amplifier 18 and/or transistors M7, M8, M9 amplify an output (e.g., outputs 60, 62) of a first oscillator (e.g. quadrature-phase oscillator 14) with a gain that is determined based on an adjustable gain parameter (e.g., frequency tuning signal 54) to generate an amplified output signal (100). Inductors L1, L2, L3, L4 inductively couple the amplified output signal to an output (e.g., outputs 56, 58) of a second oscillator (e.g., in-phase oscillator 12) (102).

In some examples, a coupling circuit (e.g., transistors M3, M4) amplify the output (e.g., outputs 60, 62) of the first oscillator (e.g., quadrature-phase oscillator 14) to generate a second amplified output signal. In such examples, the coupling circuit (e.g., the drains of transistors M3, M4) may directly couple the second amplified output signal to the output (e.g., outputs 56, 58) of the second oscillator. In some examples, the adjustable gain parameter is an adjustable transconductance parameter (e.g., adjusting frequency tuning signal 54 may adjust the transconductance of transistor M7).

FIG. 4 is a flow diagram illustrating another example technique for tuning a quadrature oscillator according to this disclosure. The technique illustrated in FIG. 4 may be implemented in any of the circuits described in this disclosure, including the circuits illustrated in FIGS. 1 and 2.

Transistor M1 amplifies a first output signal (e.g. output 58) of a second oscillator (e.g., transistors M1, M2) to generate a first current (104). Transistor M3 amplifies an output signal (e.g., output 62) at the output of a first oscillator (e.g., transistors M11, M12) to generate a second current (106). Transistor M7 amplifies the output signal (e.g., output 62) at the output of the first oscillator (e.g., transistors M11, M12) to generate a third current (108).

A junction node formed at the drains of transistors M1, M3 combines the first and second currents to form a first current component of a fourth current that flows through a current path formed between rail 42 and the drains of transistors M1, M3 (110). Inductors L1, L2 inductively couple the third current to the current path to generate a second current component of the fourth current that flows through the current path (112). Inductor L2 converts the fourth current to a voltage that forms the second output signal (e.g., output 56) of the second oscillator (e.g., transistors M1, M2) (114). The second output signal may be 180 degrees out of phase with the first output signal.

This disclosure describes techniques for VCO tuning. A high quality varactor diode may be used for frequency tuning in low frequency VCOs. At high frequencies, however, a high quality varactor diode may not necessarily be available. This disclosure describes techniques that may, in some examples, provide for frequency tuning of a quadrature oscillator without requiring the use of a varactor diode. In some examples, the techniques of this disclosure may use the quadrature signal in a quadrature oscillator with a variable gain amplifier (VGA) to provide reactive tuning.

In some examples, the techniques and/or circuitry described in this disclosure may be fully integrated. In further examples, the circuitry described in this disclosure may be able to operate up to the same frequency at which the active components have gain without requiring the use of a varactor diode.

In FIGS. 1 and 2, signals from the two sides of the quadrature oscillator may be 90° out of phase with each other. The quadrature signals may act as a reactive signal when cross coupled. The signals may be coupled to and/or from the tank or active circuitry. The quadrature coupling may be done as part of the VGA or separately. The VGAs may provide a variable quadrature (reactive) signal for tuning.

The techniques and circuitry described in this disclosure may, in some examples, be implemented on any combination of one or more integrated circuits. Although illustrative examples have been shown and described by way of example, a wide range of alternative examples are possible within the scope of the foregoing disclosure.

What is claimed is:
1. A device comprising:
  a first oscillator having:
    a first output, and
    a second output;

a second oscillator having:
    a first output, and
    a second output;
a first coupling circuit having:
    a first input coupled to the second output of the second oscillator,
    a second input coupled to the first output of the second oscillator,
    a first output coupled to the first output of the first oscillator, and
    a second output coupled to the second output of the first oscillator;
a second coupling circuit having:
    a first input coupled to the first output of the first oscillator,
    a second input coupled to the second output of the first oscillator,
    a first output coupled to the first output of the second oscillator, and
    a second output coupled to the second output of the second oscillator;
a first variable gain amplifier having:
    a first input coupled to the second output of the second oscillator,
    a second input coupled to the first output of the second oscillator,
    a first output inductively coupled to the first output of the first oscillator,
    a second output inductively coupled to the second output of the first oscillator, and
    a gain input coupled to an adjustable frequency tuning signal; and
a second variable gain amplifier having:
    a first input coupled to the first output of the first oscillator,
    a second input coupled to the second output of the first oscillator,
    a first output inductively coupled to the first output of the second oscillator,
    a second output inductively coupled to the second output of the second oscillator, and
    a gain input coupled to the adjustable frequency tuning signal.

2. The device of claim 1, further comprising:
a first set of magnetically coupled inductors having:
    a first terminal coupled to the first output of the first variable gain amplifier, and
    a second terminal coupled to the first output of the first oscillator;
a second set of magnetically coupled inductors having:
    a first terminal coupled to the second output of the first variable gain amplifier, and
    a second terminal coupled to the second output of the first oscillator;
a third set of magnetically coupled inductors having:
    a first terminal coupled to the first output of the second variable gain amplifier, and
    a second terminal coupled to the first output of the second oscillator; and
a fourth set of magnetically coupled inductors having:
    a first terminal coupled to the second output of the second variable gain amplifier, and
    a second terminal coupled to the second output of the second oscillator.

3. The device of claim 2, wherein the first set of magnetically coupled inductors is a first transformer, the second set of magnetically coupled inductors is a second transformer, the third set of magnetically coupled inductors is a third transformer, and the fourth set of magnetically coupled inductors is a fourth transformer.

4. The device of claim 1, wherein the first variable gain amplifier is a first variable gain differential amplifier, and the second variable gain amplifier is a second variable gain differential amplifier.

5. A device comprising:
a first oscillator having an output;
a second oscillator having an output;
a coupling circuit having:
    an input coupled to the output of the second oscillator, and
    an output directly coupled to the output of the first oscillator; and
a variable gain amplifier having:
    an input coupled to the output of the second oscillator, and
    an output inductively coupled to the output of the first oscillator.

6. The device of claim 5, further comprising:
a set of magnetically coupled inductors having:
    a first terminal coupled to the output of the variable gain amplifier, and
    a second terminal coupled to the output of the first oscillator.

7. The device of claim 6, wherein the set of magnetically coupled inductors includes one or more transformers.

8. The device of claim 6,
wherein the variable gain amplifier is configured to amplify the output of the second oscillator with a gain that is determined based on an adjustable gain parameter to generate an amplified output signal, and
wherein the set of magnetically coupled inductors is configured to inductively couple the amplified output signal to the output of the first oscillator.

9. The device of claim 5, wherein the variable gain amplifier includes a gain input configured to receive an adjustable gain parameter.

10. The device of claim 5, further comprising:
a second variable gain amplifier having:
    an input coupled to the output of the first oscillator, and
    an output inductively coupled to the output of the second oscillator.

11. The device of claim 5, wherein the output of the first oscillator includes a first output and a second output, the device further comprising:
a set of mutually coupled inductors having:
    a first terminal; and
    a second terminal coupled to the first output of the first oscillator,
wherein the first oscillator includes a first transistor having:
    a source terminal coupled to one or more current sources,
    a drain terminal coupled to the first output of the first oscillator and to the second terminal of the set of mutually coupled inductors, and
    a gate terminal coupled to a second output of the first oscillator,
wherein the coupling circuit includes a second transistor having:
    a source terminal coupled to the one or more current sources, a drain terminal coupled to the first output of the first oscillator, the drain terminal of the first transistor, and the second terminal of the set of mutually coupled inductors, and a gate terminal coupled to the output of the second oscillator, and wherein the variable gain amplifier includes a third transistor having:

a source terminal coupled to a current source, a drain terminal coupled to the first terminal of the set of mutually coupled inductors, and a gate terminal coupled to the output of the second oscillator.

12. The device of claim 5, wherein the output of the first oscillator includes a first output and a second output, wherein the first oscillator includes a first transistor configured to generate a first current based on the second output of the first oscillator, wherein the coupling circuit includes a second transistor configured to generate a second current based on the output of the second oscillator, wherein the variable gain amplifier includes a third transistor configured to generate a third current based on the output of the second oscillator, wherein the first oscillator further includes a current path, and a junction node configured to combine the first and second currents to form a first current component of a fourth current that flows through the current path, wherein the device further includes a set of mutually coupled inductors configured to inductively couple the third current to the current path to generate a second current component of the fourth current that flows through the current path, and wherein the device further includes circuitry configured convert the fourth current to a voltage that forms the first output of the first oscillator.

13. A method comprising:

amplifying an output of a first oscillator with a gain that is determined based on an adjustable gain parameter to generate a first amplified output signal;

inductively coupling the first amplified output signal to an output of a second oscillator;

amplifying the output of the first oscillator to generate a second amplified output signal; and directly coupling the second amplified output signal to the output of the second oscillator.

14. The method of claim 13, wherein the output of the second oscillator includes a first output signal and a second output signal 180 degrees out of phase with the first output signal, wherein the method further comprises amplifying the first output signal of the second oscillator to generate a first current, wherein the method further comprises amplifying an output signal at the output of the first oscillator to generate a second current, wherein amplifying the output of the first oscillator with the gain that is determined based on the adjustable gain parameter comprises amplifying the output signal at the output of the first oscillator to generate a third current, combining the first and second currents at a junction node to form a first current component of a fourth current that flows through a current path;

inductively coupling the third current to the current path to generate a second current component of the fourth current that flows through the current path; and converting the fourth current to a voltage that forms the second output signal of the second oscillator.

15. The method of claim 13, wherein the adjustable gain parameter is an adjustable transconductance parameter.

16. A device comprising circuitry configured to:

amplify an output of a first oscillator with a gain that is determined based on an adjustable gain parameter to generate a first amplified output signal;

inductively couple the first amplified output signal to an output of a second oscillator;

amplify the output of the first oscillator to generate a second amplified output signal; and directly couple the second amplified output signal to the output of the second oscillator.

17. The device of claim 16, wherein the output of the second oscillator includes a first output signal and a second output signal 180 degrees out of phase with the first output signal, the circuitry being further configured to:

amplify the first output signal of the second oscillator to generate a first current, amplify an output signal at the output of the first oscillator to generate a second current, amplify the output signal at the output of the first oscillator to generate a third current, combine the first and second currents at a junction node to form a first current component of a fourth current that flows through a current path;

inductively couple the third current to the current path to generate a second current component of the fourth current that flows through the current path; and convert the fourth current to a voltage that forms the second output signal of the second oscillator.

18. The device of claim 16, wherein the adjustable gain parameter is an adjustable transconductance parameter.

* * * * *